United States Patent
Wolberg et al.

(10) Patent No.: US 10,716,080 B2
(45) Date of Patent: Jul. 14, 2020

(54) CALIBRATION TECHNIQUES FOR ENVELOPE TRACKING POWER AMPLIFIERS

(71) Applicant: Apple Inc., Cupertino, CA (US)

(72) Inventors: Dan Wolberg, Moshav Yanov (IL); Shai Rachamim, Yavne (IL)

(73) Assignee: APPLE INC., Cupertino, CA (US)

( * ) Notice: Subject to any disclaimer, the term of this patent is extended or adjusted under 35 U.S.C. 154(b) by 462 days.

(21) Appl. No.: 15/019,421

(22) Filed: Feb. 9, 2016

(65) Prior Publication Data
US 2017/0230924 A1 Aug. 10, 2017

(51) Int. Cl.
H04W 56/00 (2009.01)
H03F 1/02 (2006.01)
H03F 3/24 (2006.01)
H03F 3/195 (2006.01)

(52) U.S. Cl.
CPC ........ H04W 56/004 (2013.01); H03F 1/0222 (2013.01); H03F 3/195 (2013.01); H03F 3/245 (2013.01); H04W 56/0065 (2013.01); H03F 2200/102 (2013.01); H03F 2200/336 (2013.01); H03F 2200/451 (2013.01)

(58) Field of Classification Search
CPC combination set(s) only.
See application file for complete search history.

(56) References Cited

U.S. PATENT DOCUMENTS

| 3,660,761 | A | * | 5/1972 | Harmon, Jr. | ...... H04L 25/03019 375/231 |
| 6,895,230 | B1 | * | 5/2005 | Blount | .................... H04B 7/084 342/174 |
| 8,605,774 | B2 | | 12/2013 | Rupp et al. | |
| 9,537,519 | B2 | | 1/2017 | El-Hassan et al. | |
| 2005/0079835 | A1 | * | 4/2005 | Takabayashi | ............. H03F 3/24 455/127.1 |
| 2007/0014382 | A1 | * | 1/2007 | Shakeshaft | ........... H03F 1/0233 375/297 |
| 2007/0249304 | A1 | * | 10/2007 | Snelgrove | ............. H03F 1/0205 455/127.2 |

(Continued)

OTHER PUBLICATIONS

Agilent; "Digital Modulation in Communications Systems—An Introduction," Mar. 14, 2001;.

(Continued)

Primary Examiner — Zhiyu Lu
(74) Attorney, Agent, or Firm — Fletcher Yoder PC

(57) ABSTRACT

There is provided a technique for calibrating the envelope tracking circuitry of the wireless interface of an electronic device to compensate for any delay mismatch between the IQ signal path and the envelope path. The desired levels of input test signals are determined to assure that they are sensitive to any delay mismatch which may be in the system. The propagation delay from the signal generator to the signal analyzer of the envelope tracking system is estimated and delay compensation is performed. To reduce the noise of the measurement, distortion in the received signal may also be determined and noise compensation may also be performed. Based on these determinations, the envelope tracking circuitry may be calibrated by introducing an appropriate delay in either the envelope path or the IQ signal path.

28 Claims, 13 Drawing Sheets

(56) References Cited

U.S. PATENT DOCUMENTS

| | | | | |
|---|---|---|---|---|
| 2009/0097591 A1* | 4/2009 | Kim | ................. | H03F 1/0222 |
| | | | | 375/297 |
| 2012/0200354 A1* | 8/2012 | Ripley | ................. | H03F 1/0227 |
| | | | | 330/131 |
| 2012/0200435 A1* | 8/2012 | Ngo | ................. | H03M 7/3073 |
| | | | | 341/61 |
| 2013/0034139 A1 | 2/2013 | Khlat et al. | | |
| 2013/0231069 A1 | 9/2013 | Drogi | | |
| 2014/0241462 A1* | 8/2014 | Bellaouar | ............. | H03F 1/3241 |
| | | | | 375/297 |
| 2015/0280674 A1* | 10/2015 | Langer | ................. | H03G 3/3042 |
| | | | | 375/295 |
| 2015/0326327 A1* | 11/2015 | Carlsson | ............... | H03F 1/0222 |
| | | | | 375/224 |

OTHER PUBLICATIONS

Tektronix; "What's Your IQ—About Quadrature Signals;" https://www.tek.com/blog/what%E2%80%99s-your-iq-%E2%80%93-about-quadrature-signals%E2%80%A6; Apr. 16, 2013; 8 pages.

Hekkala, A. et al.; "Adaptive Time Misalignment Compensation in Envelope Tracking Amplifiers;" 2008 IEEE 10th International Symposium on Spread Spectrum Techniques and Applications; Aug. 25, 2008; 5 pages.

Wikipedia; Wireless LAN; https://en.wikipedia.org/wiki/Wireless_LAN; Dec. 17, 2015; 8 pages.

Wimpenny, G.; "Improving multi-carrier PA efficiency using envelope tracking;" EE Times; https://www.eetimes.com/document.asp?doc_id=1276336&page_number=1; Mar. 2, 2008; 6 pages.

\* cited by examiner

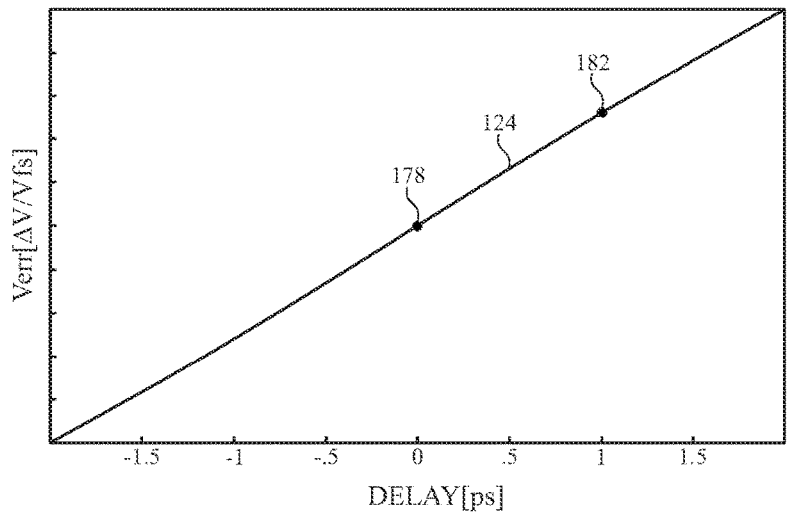
*FIG. 13*
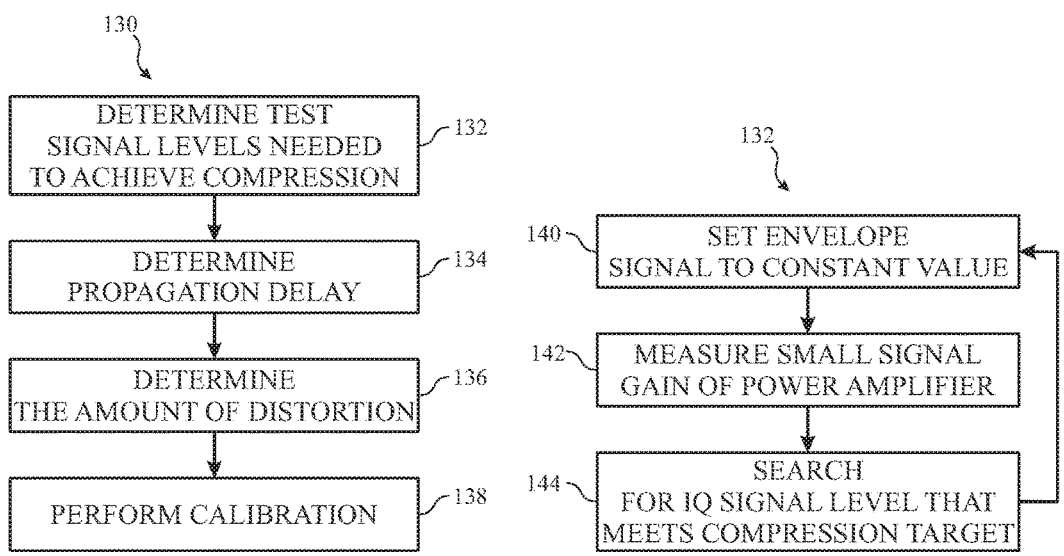
*FIG. 14*  *FIG. 15*

CALIBRATION TECHNIQUES FOR ENVELOPE TRACKING POWER AMPLIFIERS

BACKGROUND

The present disclosure relates generally to techniques for facilitating communication between two electronic devices and, more particularly, to techniques for improving the quality of a wireless communication link between electronic devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In the marketplace today, there are a wide variety of electronic devices available for a wide variety of purposes. Such devices include cellular telephones, tablet computers, laptop computers, person computers, televisions, Bluetooth© enabled devices, printers, and cameras, just to name a few. It is often desirable for one electronic device to communicate with one or more other electronic devices. To facilitate these communications, various wireless technologies have become popular. Regardless of the particular type of wireless communication technology, these technologies are all similar in the sense that they use radio waves, often referred to as radio-frequency (RF) signals, to communicate information from one device to another.

The information to be transmitted typically is modulated onto the RF signal prior to wireless transmission. In other words, the information to be transmitted is typically embedded in an envelope of a carrier signal that has a frequency in the RF range. The envelope is typically referred to as the baseband signal. For example, there are various techniques for using quadrature signals, often referred to as IQ signals, to modulate the carrier signal. The receiving device demodulates the signal, i.e., removes the carrier signal, to recover the embedded information in the envelope. In an envelope tracking system, any delay mismatch between the IQ signals and the envelope path degrades the system performance in terms of error vector magnitude (EVM) and spectral emission mask. Such delay mismatch may cause the supply to be too high, in which the case the linearization achieved by shaping the envelope is lost, or too low, in which case the signal is clipped by the power amplifier. In either case, a high EVM reduces the quality of the transmitted signal and generally causes the transmitting device to consume more power than necessary.

BRIEF DESCRIPTION OF THE DRAWINGS

Various aspects of this disclosure may be better understood upon reading the following detailed description and upon reference to the drawings in which:

FIG. 13 illustrates a distortion metric versus delay;

FIG. 14 illustrates a flowchart of an embodiment of the present calibration technique;

FIG. 15 illustrates a flowchart for determining the envelope and IQ signal levels required for compression;

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

To address some of the concerns mentioned above, it is proposed to provide a technique for calibrating the envelope tracking circuitry of the wireless interface of an electronic device to compensate for any delay mismatch between the IQ signal path and the envelope path. The proposed technique is relatively insensitive to the power amplifier curve and to the saturation level of the power amplifier. It also introduces a metric with significant sensitivity to delay mismatch, which means that it is much less prone to noise, and thus, requires less calibration time than other known techniques. In accordance with one embodiment discussed in detail below, the desired levels of input test signals are determined to assure that they are sensitive to any delay mismatch which may be in the system. The propagation delay from the signal generator to the signal analyzer of the envelope tracking system is estimated and delay compensation is performed. To reduce the noise of the measurement, distortion in the received signal may also be determined and noise compensation may also be performed. Based on these determinations, the envelope tracking circuitry may be calibrated by introducing an appropriate delay in either the envelope path or the IQ signal path. The calibration techniques discussed herein may be performed using external equipment at the factory producing the electronic devices, by placing the electronic device in an initial test mode, and/or at any time, e.g., power up, response to temperature changes, etc.

Figure 1:
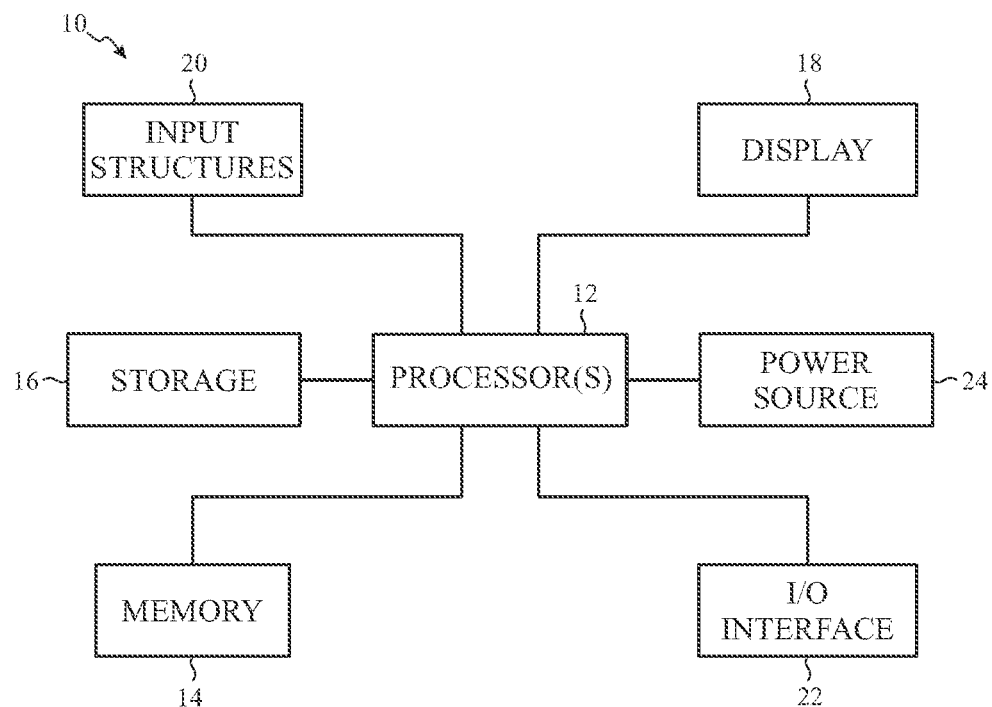
FIG. 1 is a schematic block diagram of an electronic device in accordance with an embodiment.

With these features in mind, a general description of suitable electronic devices that may use wireless RF links is provided. Turning first to FIG. 1, an electronic device 10 according to an embodiment of the present disclosure may include, among other things, one or more processor(s) 12, memory 14, nonvolatile storage 16, a display 18, input structures 20, an input/output (I/O) interface 22 and a power source 24. The various functional blocks shown in FIG. 1 may include hardware elements (e.g., including circuitry), software elements (e.g., including computer code stored on a computer-readable medium) or a combination of both hardware and software elements. It should be noted that FIG. 1 is merely one example of a particular implementation and is intended to illustrate the types of components that may be present in electronic device 10.

Figure 2:
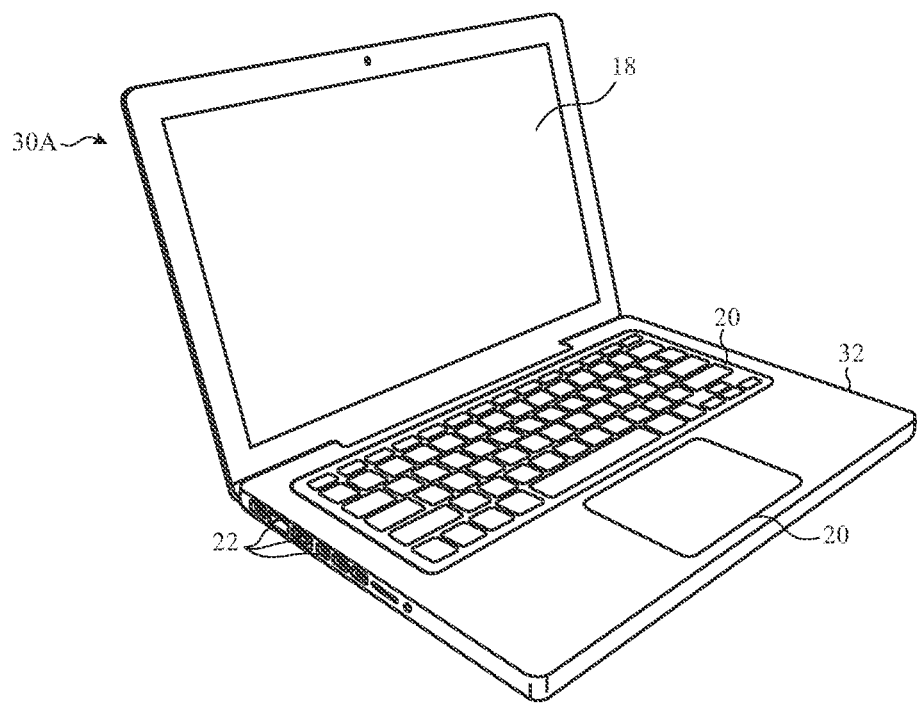
FIG. 2 is a perspective view of a notebook computer representing an embodiment of the electronic device of FIG. 1.
Figure 3:
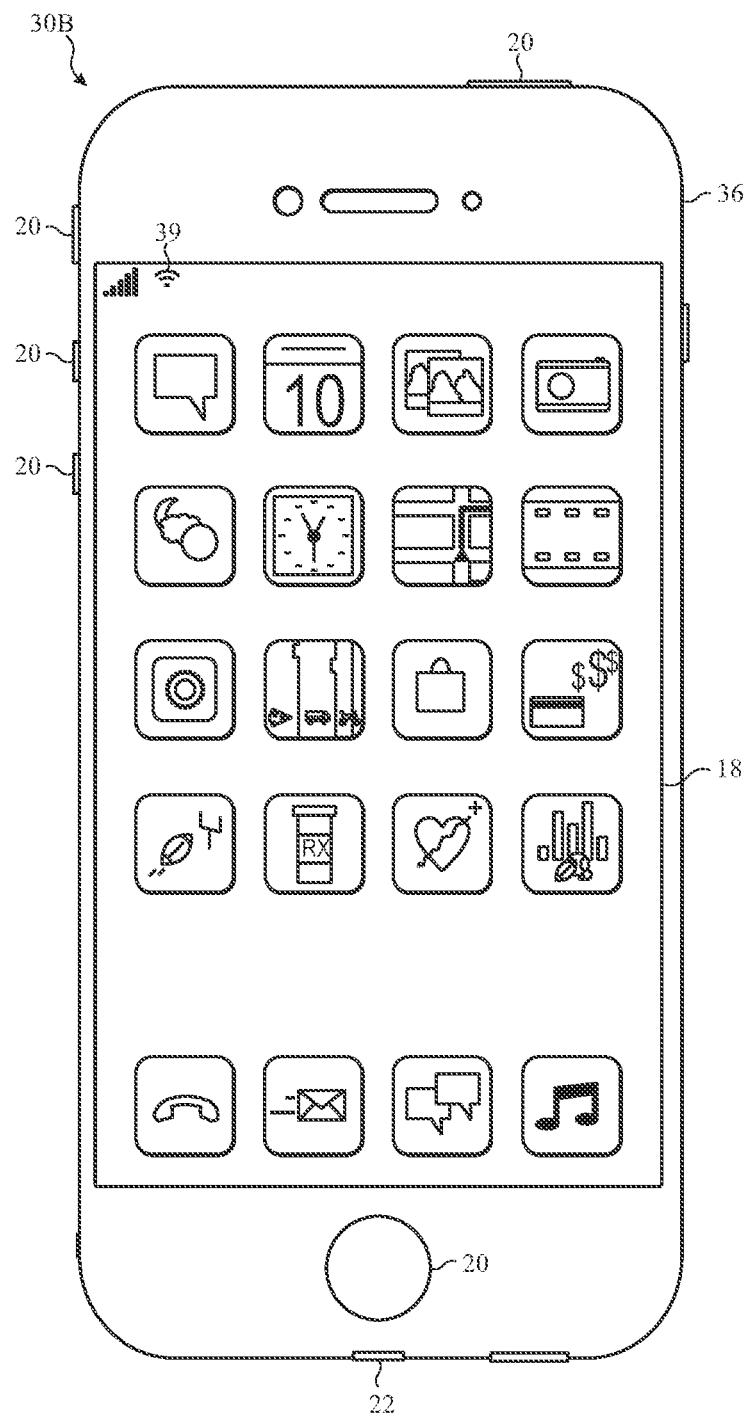
FIG. 3 is a front view of a hand-held device representing another embodiment of the electronic device of FIG. 1.
Figure 4:
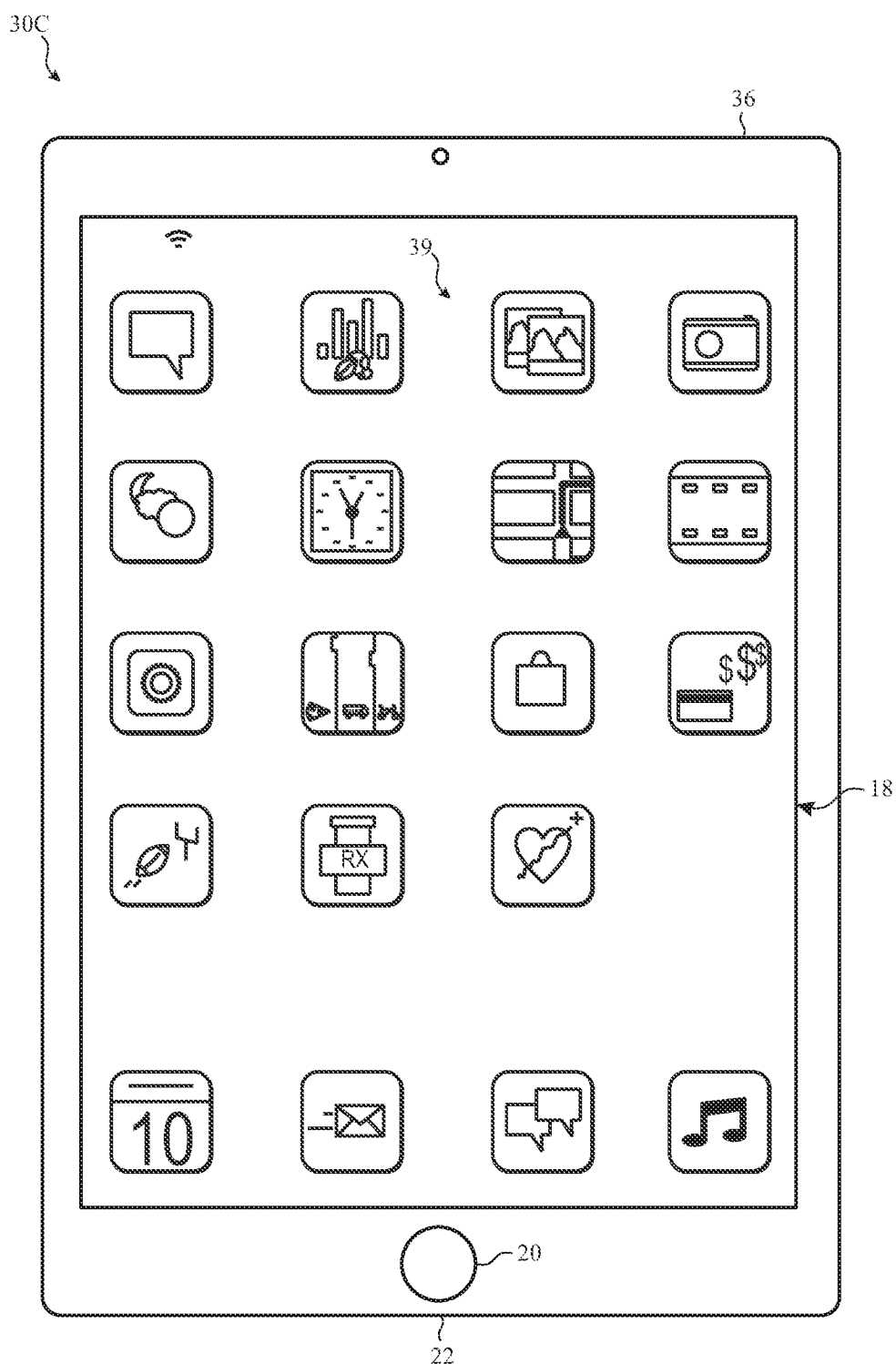
FIG. 4 is a front view of another hand-held device representing another embodiment of the electronic device of FIG. 1.
Figure 5:
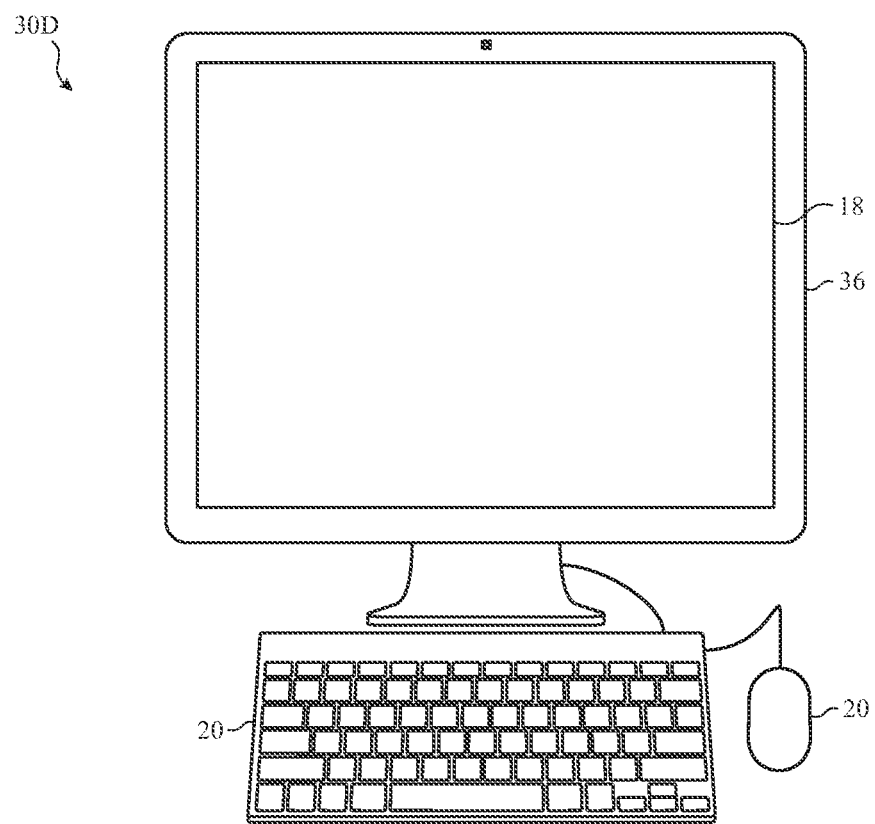
FIG. 5 is a front view of a desktop computer representing another embodiment of the electronic device of FIG. 1.
Figure 6:
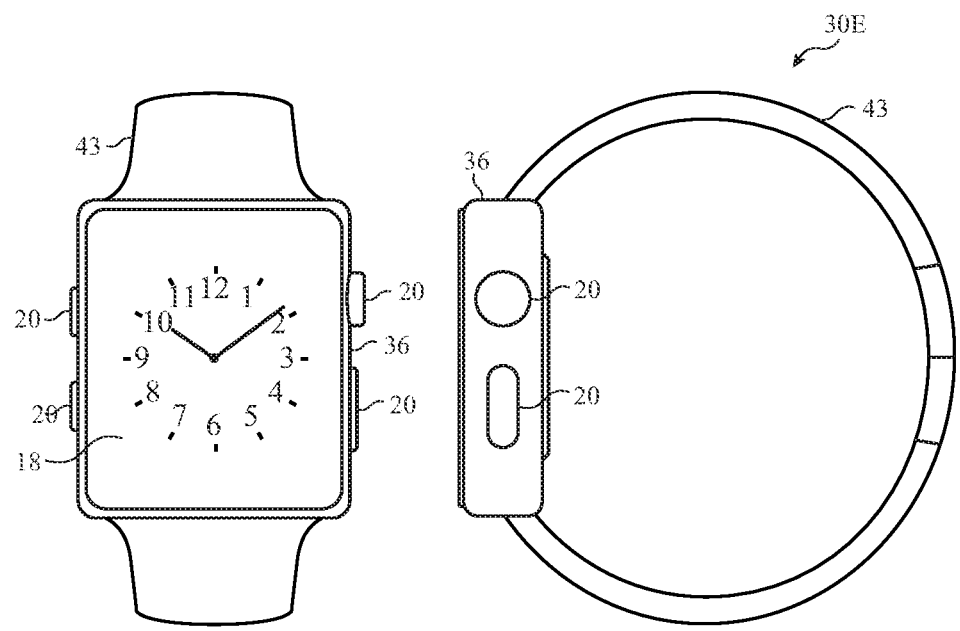
FIG. 6 is a front view of a wearable electronic device representing another embodiment of the electronic device of FIG. 1.

By way of example, the electronic device 10 may represent a block diagram of the notebook computer depicted in FIG. 2, the handheld device depicted in either of FIG. 3 or FIG. 4, the desktop computer depicted in FIG. 5, the wearable electronic device depicted in FIG. 6, or similar devices. It should be noted that the processor(s) 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 and/or other data processing circuitry may be operably coupled with the memory 14 and the nonvolatile storage 16 to perform various algorithms. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., e.g., an operating system) encoded on such a computer program product may also include instructions that may be executed by the processor(s) 12 to enable the electronic device 10 to provide various functionalities.

In certain embodiments, the display 18 may be a liquid crystal display (e.g., LCD), which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more light emitting diode (e.g., LED) displays, or some combination of LCD panels and LED panels.

The input structures 20 of the electronic device 10 may enable a user to interact with the electronic device 10 (e.g., e.g., pressing a button to increase or decrease a volume level). The I/O interface 22 may enable electronic device 10 to interface with various other electronic devices. The I/O interface 22 may include various types of ports that may be connected to cabling. These ports may include standardized and/or proprietary ports, such as USB, RS232, Apple's Lightning® connector. The I/O interface 22 may also include, for example, interfaces for a personal area network (e.g., PAN), such as a Bluetooth network, for a local area network (e.g., LAN) or wireless local area network (e.g., WLAN), such as an 802.11x Wi-Fi network, and/or for a wide area network (e.g., WAN), such as a $3^{rd}$ generation (e.g., 3G) cellular network, $4^{th}$ generation (e.g., 4G) cellular network, or long term evolution (e.g., LTE) cellular network. The I/O interface 22 may also include interfaces for, for example, broadband fixed wireless access networks (e.g., WiMAX), mobile broadband Wireless networks (e.g., mobile WiMAX), and so forth.

As further illustrated, the electronic device 10 may include a power source 24. The power source 24 may include any suitable source of power, such as a rechargeable lithium polymer (e.g., Li-poly) battery and/or an alternating current (e.g., AC) power converter. The power source 24 may be removable, such as replaceable battery cell.

In certain embodiments, the electronic device 10 may take the form of a computer, a portable electronic device, a wearable electronic device, or other type of electronic device. Such computers may include computers that are generally portable (e.g., such as laptop, notebook, and tablet computers) as well as computers that are generally used in one place (e.g., such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 30A, is illustrated in FIG. 2 in accordance with one embodiment of the present disclosure. The depicted computer 30A may include a housing or enclosure 32, a display 18, input structures 20, and ports of the I/O interface 22. In one embodiment, the input structures 20 (e.g., such as a keyboard and/or touchpad) may be used to interact with the computer 30A, such as to start, control, or operate a GUI or applications running on computer 30A.

For example, a keyboard and/or touchpad may allow a user to navigate a user interface or application interface displayed on display 18.

FIG. 3 depicts a front view of a handheld device 30B, which represents one embodiment of the electronic device 10. The handheld device 30B may represent, for example, a portable phone, a media player, a personal data organizer, a handheld game platform, or any combination of such devices. By way of example, the handheld device 30B may be a model of an iPod® or iPhone® available from Apple Inc. of Cupertino, Calif.

The handheld device 30B may include an enclosure 36 to protect interior components from physical damage and to shield them from electromagnetic interference. The enclosure 36 may surround the display 18, which may display indicator icons 39. The indicator icons 39 may indicate, among other things, a cellular signal strength, Bluetooth connection, and/or battery life. The I/O interfaces 22 may open through the enclosure 36 and may include, for example, an I/O port for a hard wired connection for charging and/or content manipulation using a connector and protocol, such as the Lightning connector provided by Apple Inc., a universal serial bus (e.g., USB), or other connectors and protocols.

User input structures 20, in combination with the display 18, may allow a user to control the handheld device 30B. For example, one of the input structures 20 may activate or deactivate the handheld device 30B, one of the input structures 20 may navigate user interface to a home screen, a user-configurable application screen, and/or activate a voice-recognition feature of the handheld device 30B, while other of the input structures 20 may provide volume control, or may toggle between vibrate and ring modes. Additional input structures 20 may also include a microphone may obtain a user's voice for various voice-related features, and a speaker to allow for audio playback and/or certain phone capabilities. The input structures 20 may also include a headphone input to provide a connection to external speakers and/or headphones.

FIG. 4 depicts a front view of another handheld device 30C, which represents another embodiment of the electronic device 10. The handheld device 30C may represent, for example, a tablet computer, or one of various portable computing devices. By way of example, the handheld device 30C may be a tablet-sized embodiment of the electronic device 10, which may be, for example, a model of an iPad® available from Apple Inc. of Cupertino, Calif.

Turning to FIG. 5, a computer 30D may represent another embodiment of the electronic device 10 of FIG. 1. The computer 30D may be any computer, such as a desktop computer, a server, or a notebook computer, but may also be a standalone media player or video gaming machine. By way of example, the computer 30D may be an iMac®, a MacBook®, or other similar device by Apple Inc. It should be noted that the computer 30D may also represent a personal computer (e.g., PC) by another manufacturer. A similar enclosure 36 may be provided to protect and enclose internal components of the computer 30D such as the dual-layer display 18. In certain embodiments, a user of the computer 30D may interact with the computer 30D using various peripheral input structures 20, such as the keyboard or mouse, which may connect to the computer 30D via a wired and/or wireless I/O interface 22.

Similarly, FIG. 6 depicts a wearable electronic device 30E representing another embodiment of the electronic device 10 of FIG. 1 that may be configured to operate using the techniques described herein. By way of example, the wearable electronic device 30E, which may include a wristband 43, may be an Apple Watch® by Apple, Inc. However, in other embodiments, the wearable electronic device 30E may include any wearable electronic device such as, for example, a wearable exercise monitoring device (e.g., e.g., pedometer, accelerometer, heart rate monitor), or other device by another manufacturer. The display 18 of the wearable electronic device 30E may include a touch screen (e.g., e.g., LCD, OLED display, active-matrix organic light emitting diode (e.g., AMOLED) display, and so forth), which may allow users to interact with a user interface of the wearable electronic device 30E.

Figure 7:
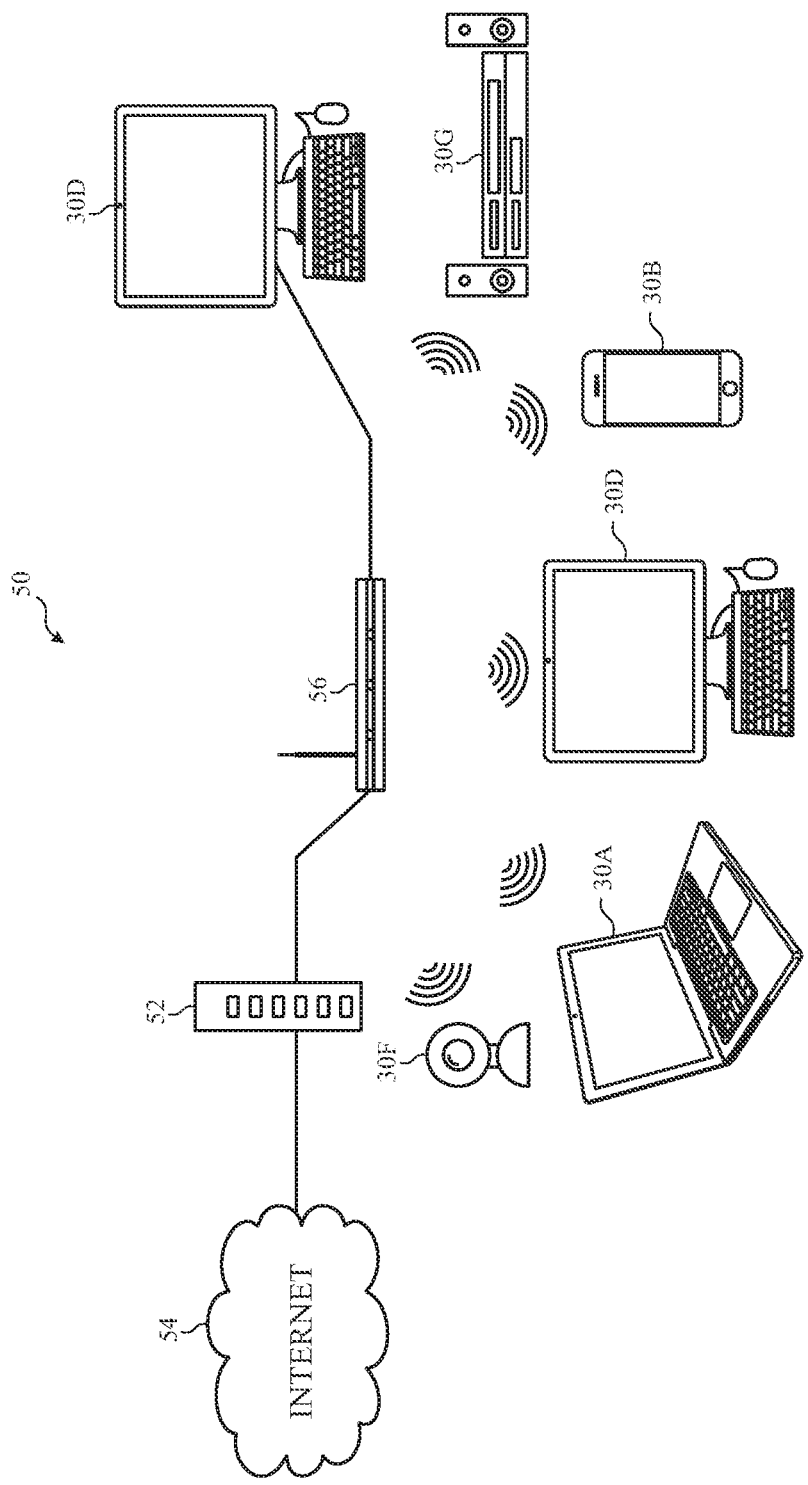
FIG. 7 is a diagram illustrating an example of a wireless local area network (WLAN)

One or more electronic devices, such as the electronic devices 30 discussed above, may wirelessly communicate with one another or with the Internet via a wireless local area network (WLAN), such as the WLAN 50 illustrated by example in FIG. 7. In this example, the WLAN 50 includes a modem 52 that may communicate information to and from the Internet 54 via a wireless router or access point 56. The wireless router 56 may include a wireless I/O interface 24, such as discussed above, to allow it to transmit and receive RF signals so that it can wirelessly communicate with other devices. For instance, the illustrated example shows the wireless router 56 wirelessly communicating with a notebook computer 30A, a handheld device 30B, a personal computer 30D, a wireless camera 30F, and a wireless entertainment system 30G. Of course, the wireless router 56 may also be hardwired to other devices, such as the personal computer 30D.

Figure 8:
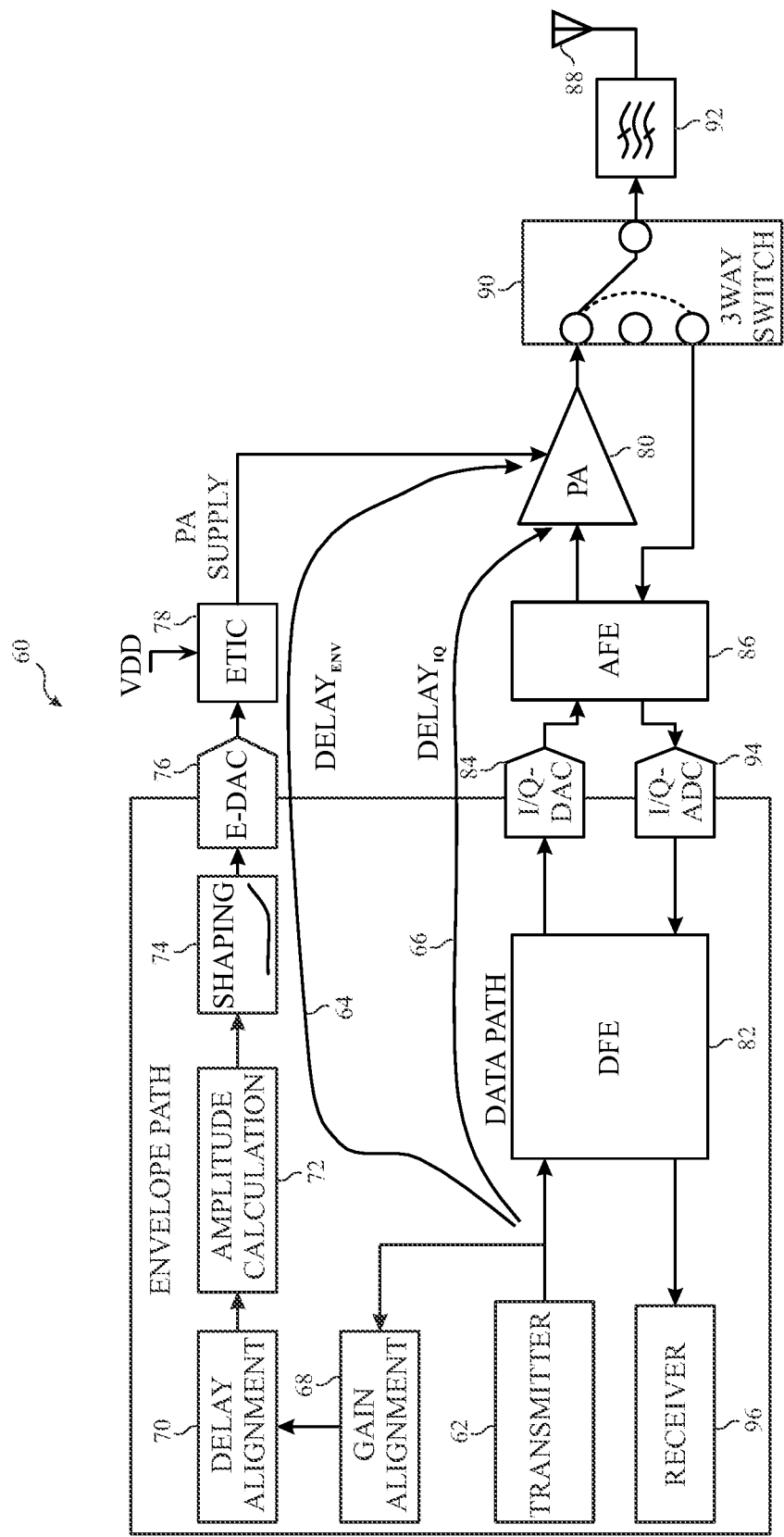
FIG. 8 is a block diagram of an envelope tracking circuit.

As alluded to above, the I/O interface 22 of the various electronic devices 30 may include an envelope tracking circuit, such as the envelope tracking circuit 60 illustrated in FIG. 8. The transmitter 62 generates an IQ modulated signal, using an 802.11 packet generator, for example. The upper path of the envelope tacking circuit 60 constitutes the envelope path 64 with its associated delay DELAYenv, and the lower path of the envelope tracking circuit 60 is the IQ data path 66 with its associated delay DELAY iq. The envelope path 64 includes gain alignment circuitry 68, delay alignment circuitry 70, amplitude calculation 72, a shaping circuit 74, a digital to analog converter 76, and an envelope tracking integrated circuit 78, the output of which is supplied to the power amplifier 80. The IQ data path 66 includes a digital front end (DFE) 82, a digital to analog converter 84, and an analog front end (AFE) 86, the output of which is delivered to the power amplifier 80. The power amplifier 80 amplifies the IQ signal while the envelope signal controls the response of the power amplifier 80 by biasing its power supply. The power amplifier 80 passes the signals to an antenna 88 via a switch 90 and a filter 92. The antenna 88 is not only suitable for transmitting the RF signal from the power amplifier 80, but also effective for receiving RF signals from other electronic devices. These received signals are passed through the filter 92 and the switch 90 to the analog front end 86, analog to digital converter 94, and the digital front end 82, to a receiver 96. As will be discussed in greater detail below, any delay difference between the envelope path 64 and the IQ data path 66 may be calibrated using the delay alignment circuitry 70 in the envelope path 66. Of course, other techniques may be used, such as using the digital front end 82 which include similar delay alignment features.

Figure 9:
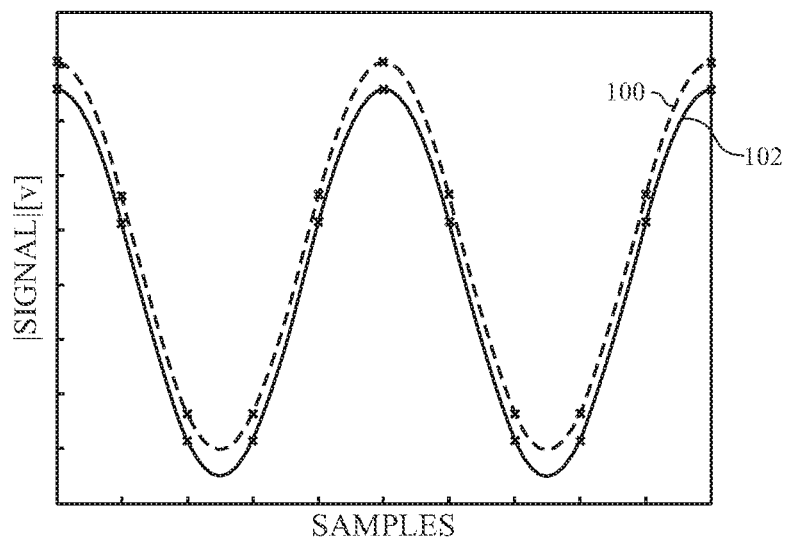
FIG. 9 is a graph that illustrates signals on an envelope path and an IQ path where both signal paths are aligned.
Figure 10:
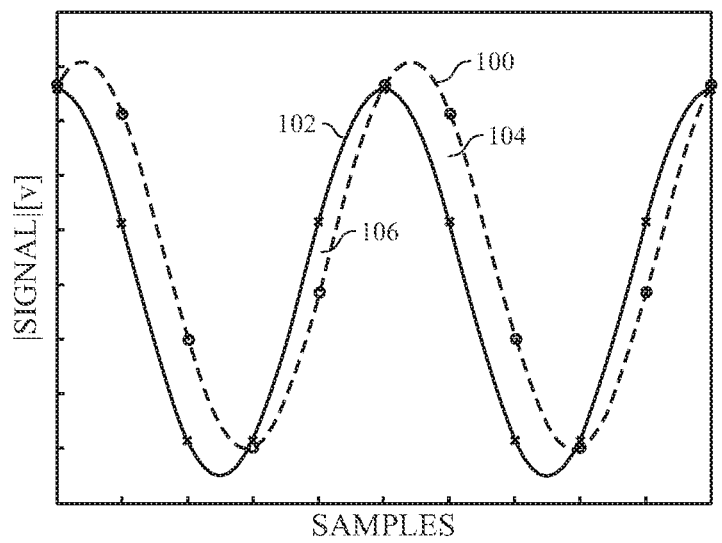
FIG. 10 is a graph that illustrates signals on the envelope path and IQ path where there is a delay between the signal paths.

The calibration technique described herein is performed using test signals, such as an AM (DSB-SC) signal, which is an amplitude modulated double sideband suppressed carrier cosine, as a test signal. To best show how delay may affect a test signal, the technique proposes that the level of the test signal should be selected to ensure that it is highly compressed, e.g., the power amplifier 80 should be near saturation. If the test signal is deeply compressed, any delay that is introduced between the envelope path 64 and the IQ signal path 66 will distort the signal at the output significantly. By way of example, FIG. 9 illustrates test signals on both paths 64 and 66 that are aligned. Specifically, the envelope signal 100 is aligned with the IQ signal 102. When DELAYenv in the envelope path 64 is substantially equal to DELAYiq in the IQ signal path 66, the envelope signal 100 and the IQ signal 102 are substantially aligned so that there is little degradation in EVM and spectral emission performance. However, if there is a difference in delay between the envelope path 64 and the IQ signal path 66, the signals will not be aligned, as illustrated in FIG. 10. Here, the envelope signal 100 is delayed relative to the IQ signal 102, such as by ten nanoseconds for example. Because of the misalignment, in the area 104, the supply voltage is higher with respect to the time aligned supply voltage, and therefore the output will be less compressed. On the other hand, in the area 106, the supply voltage is lower, and therefore the output will be more compressed.

Figure 11:
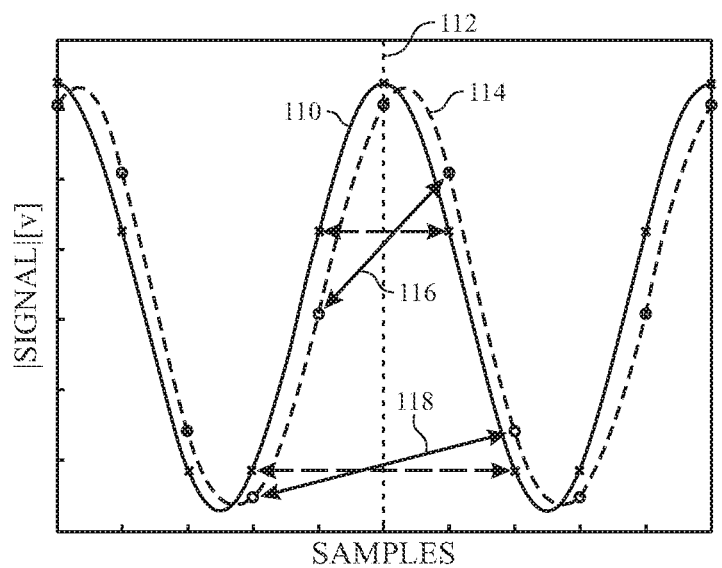
FIG. 11 is a graph that illustrates distortion in the output of the power amplifier when the envelope and IQ signals are not aligned.

FIG. 11 depicts the distortion in the output of the power amplifier 80.

Figure 12:
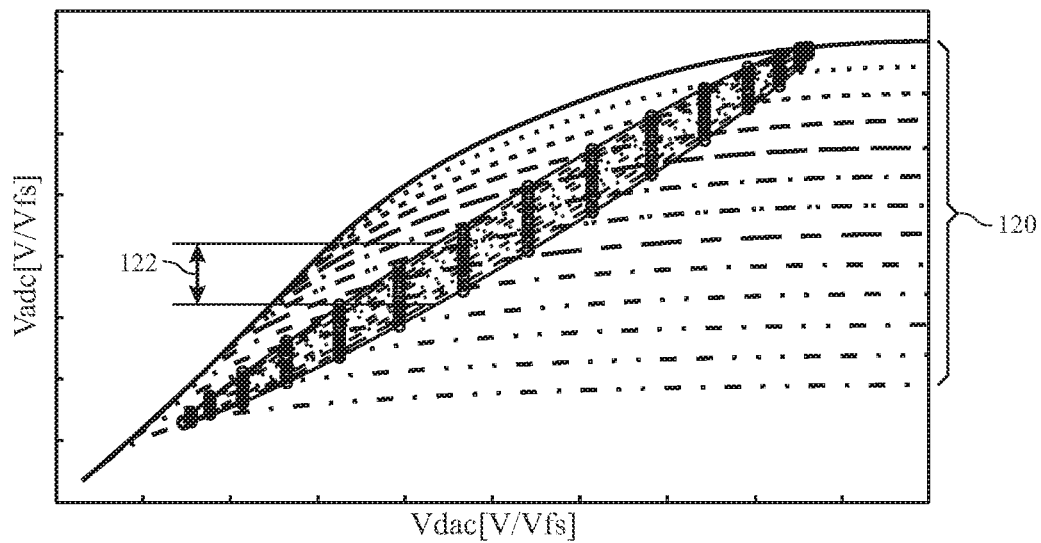
FIG. 12 shows the same output distortion as FIG. 11 as trajectories on the power amplifier gain and amplification curves.

When the input signals are time aligned, as illustrated in FIG. 9, the output signal 110 of the power amplifier 80 is symmetric around the zero phase line 112. However, when the input signals are not time aligned, as illustrated in FIG. 10, the output signal 114 of the power amplifier 80 is asymmetric around the zero phase line 112. The level of asymmetry as shown by the lines 116 and 118 represents a delay metric. Indeed, this same output distortion may be visualized as a pseudo ellipse around the expected output signal levels as illustrated in FIG. 12. Here, the various curves 120 represent the gain and amplification curves of the power amplifier 80 in response to different input signal levels. The size of the minor radius of the pseudo ellipse 122 increases with the delay mismatch. FIG. 13 illustrates the digested metric 124 where the size of the minor radius of the pseudo ellipse 122, or the maximum delta between samples as illustrated in FIG. 11, increases with the delay mismatch.

Given this background, a technique for calibrating such delay mismatch out of an envelope tracking circuit, such as the envelope tracking circuit 60 illustrated in FIG. 8, is set forth in the flow chart 130 illustrated in FIG. 14. As would be understood by one of ordinary skill in the art, this technique may be performed by an external or internal calibration device (not shown) operably coupled to the envelope tracking circuit 60. As alluded to previously, the first step in the calibration technique is to determine the test signal levels that are needed to achieve compression (block 132). As discussed previously, it is useful to use test signals that are highly compressed so that the power amplifier 80 is near saturation, since such signals will distort the output signal significantly and, thus, make it easier to determine the extent of the delay mismatch between the envelope path 64 and the IQ data signal path 66. Once the appropriate test signal levels have been determined, they may be used to determine the extent of the delay mismatch between the envelope path 64 and the IQ data signal path 66 so that a timing alignment may be performed (block 134). The timing alignment, e.g., the absolute delay of the IQ path, is used to enable a proper metric for the delay mismatch between the paths 64 and 66. Timing alignment is represented by the zero phase line 112 depicted in FIG. 11. Once the propagation delay has been determined, the amount of distortion in the signal may also be determined (block 136). Based on these metrics, the envelope tacking circuit 60 may be calibrated, such as by adjusting the delay within the delay alignment circuitry 70 or the digital front end 82, as discussed previously (block 138).

One technique that may be used to determine the test signal levels that should be used to achieve an appropriate amount of compression is set forth in FIG. 15. To search for the compression region of the power amplifier 80, the level of the envelope signal may be set to a constant value from the range of the supply voltages (block 140). With this envelope signal, the small signal gain of the power amplifier 80 is measured (block 142). For the gain measurements, a continuous wave tone may be transmitted, and its energy may be estimated by means of a discrete Fourier transform. Measured gain is the ratio between the received energy and the transmitted energy. Once the small signal gain of the power amplifier 80 is determined based on the constant envelope signal, a search for an IQ signal level that meets the compression target may be performed (block 144). It should be noted that the compression target of XdB, e.g., −2 dB for example, means that the signal should drop by approximately XdB from the small signal gain measured in block 142 for a specific constant envelope level. Then, the technique may be repeated over a range of supply voltages to create a table of envelope signal levels and corresponding IQ signal levels.

Figure 16:
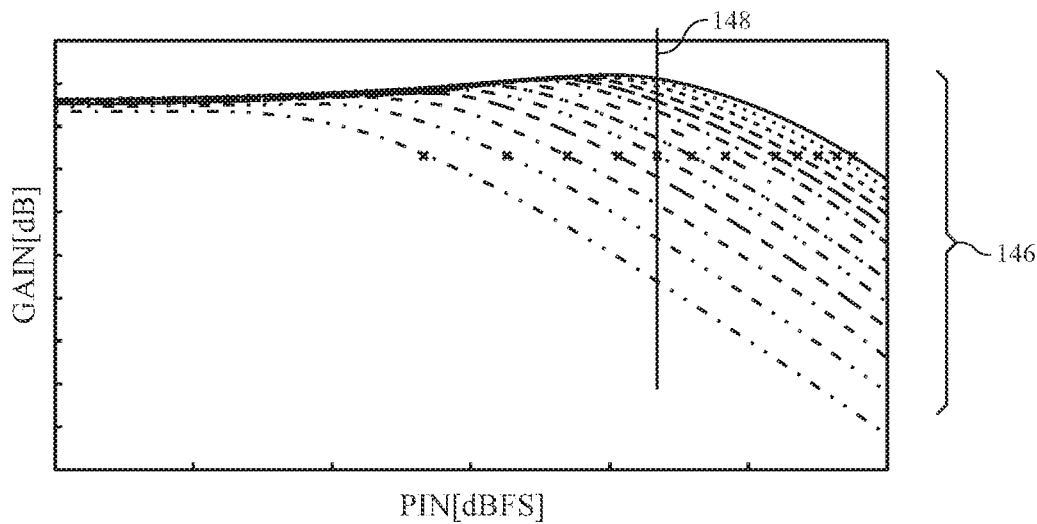
FIG. 16 illustrates a graph plotting look-up table results on gain/amplification curves.
Figure 17:
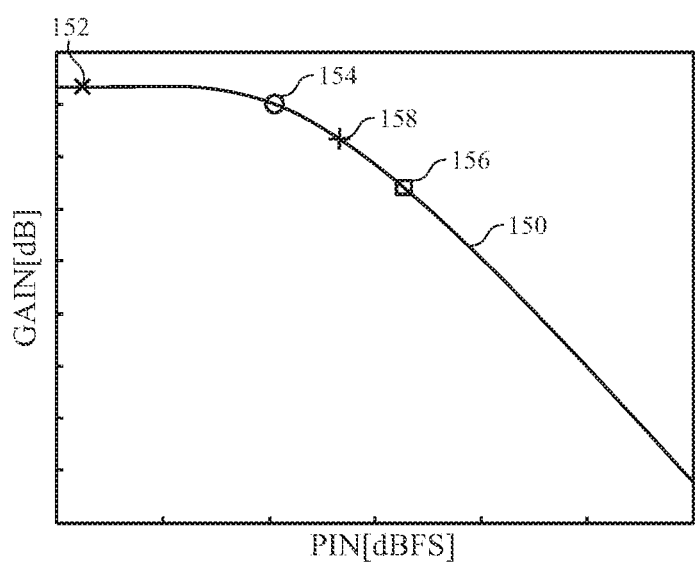
FIG. 17 illustrates an example of a search for a look-up table entry meeting a target gain.

The results from such a table may be plotted using a series of power amplifier gain curves, such as those illustrated in FIG. 16. Here, each of the curves 146 relates to a corresponding set value of the envelope signal. A search for the largest gradient between these signals may be performed to find the biggest difference in gain, as illustrated along line 148, since this will give an indication as to the appropriate test signal levels that will produce the largest amount of delay mismatch during the calibration procedure. A simple search technique, such as a binary search or bang-bang search, can be applied to obtain faster convergence, such as illustrated in FIG. 17. Here, a search is performed to find about a −2 dB drop on each Vcc curve 150. Starting at a reference voltage 152, a first sample 154 may be taken. A second sample 156 may then be taken to find a final value 158 between the two sample points 154 and 156 that is about −2 dB from the reference voltage 152. The voltage level 158 should be sufficient to provide appropriate compression for the test signals.

Figure 18:
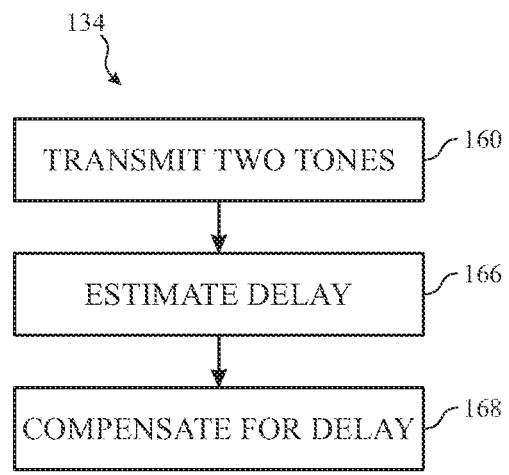
FIG. 18 illustrates a flowchart depicting an embodiment of a technique for compensating for delay.
Figure 19:
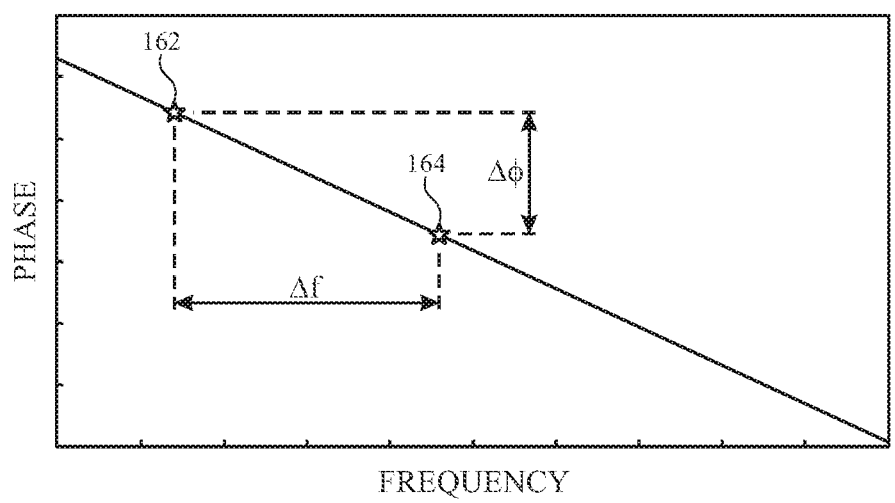
FIG. 19 illustrates an example of channel response when two or more tones are generated.

One technique for determining propagation delay is illustrated in FIG. 18. If the propagation channel does not exhibit group delay variation in the band of interest, then estimating the phase difference between any two end-band continuous wave tones of different frequencies will allow for the estimation of the propagation delay. The two tones may be transmitted either consecutively or simultaneously (block 160). For example, as illustrated in FIG. 19, the point 162 represents the frequency and phase of the first tone and the point 164 represents the frequency and phase of the second tone. Next, the delay is estimated (block 166). The delay may be determined by measuring the phase difference Asp between the first tone 162 and the second tone 164 as illustrated in FIG. 19 and dividing it by $2\pi\Delta f$. At this point, the delay in the envelope tracking circuit 60 may be compensated, in the IQ data path 66 for example, as discussed previously (block 168).

Figure 20:
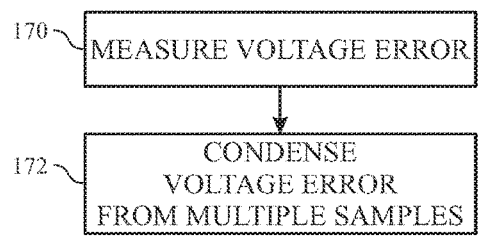
FIG. 20 illustrates a flowchart depicting an embodiment of a technique for determining the distortion of the received signal.
Figure 21:
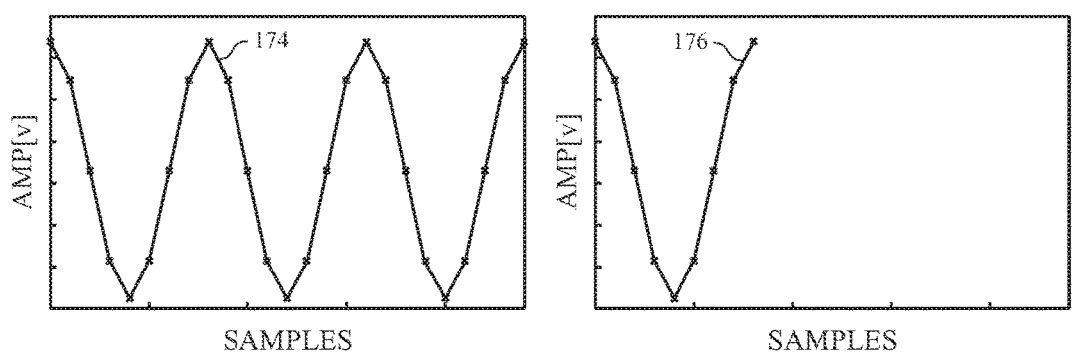
FIG. 21 illustrates graphs depicting received signals being averaged into a single noise reduced cycle.
Figure 22:
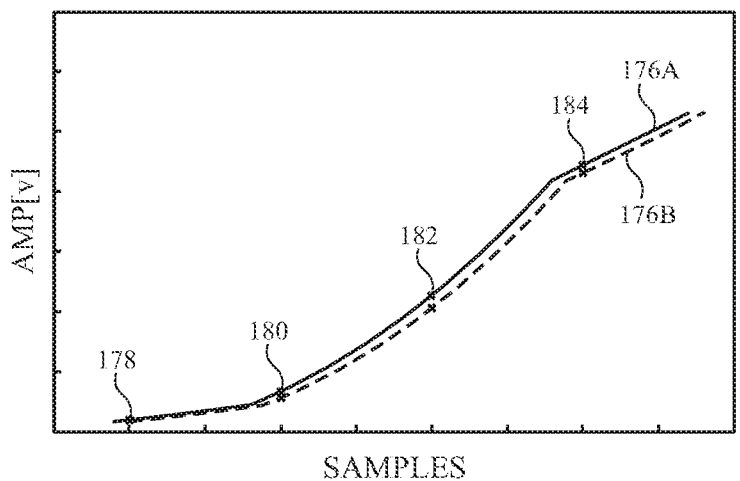
FIG. 22 illustrates matching samples on a single cycle.
Figure 23:
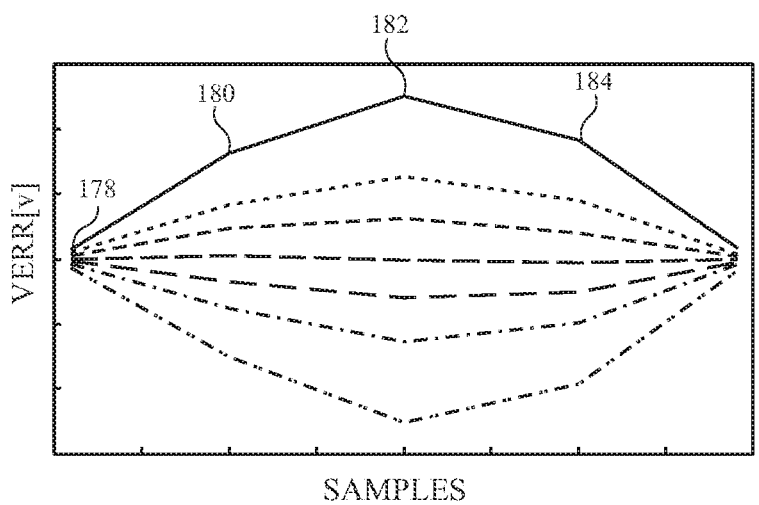
FIG. 23 illustrates a graph depicting distortion across a sample for different delay mismatch values.

While the envelope tracking circuit 60 may be calibrated (block 138) at this point by compensating for the delay in the envelope path 64 for or the IQ signal path 66 (block 168), the calibration may be further improved by considering the amount of distortion in the measurement (block 136). One technique for making this determination is illustrated in FIG. 20. Here the voltage error Verr, which is defined as the difference between matching samples of a single test cycle, may be measured (block 170). These voltage errors Verr for multiple cycles may be averaged and condensed into a single metric of either the maximum voltage error or the RMS voltage error, for example (block 172). As illustrated in FIG. 21, several cycles 174 may be averaged into a single, reduced cycle 176. The single cycle 176 may be broken into halves 176A and 176B and plotted with respect to each other as illustrated in FIG. 22. Here the distortion or difference between the two halves 176A and 176B at each sample point 178, 180, 182, and 184 may be measured to determine the voltage error Verr. The error for different delay mismatches for each sample 178, 180, 182, and 184 may be determined, as illustrated in FIG. 23. This produces the distortion metric illustrated in FIG. 13 where the first sample 178 shows no delay mismatch and is the closest sample to the symmetry point, 180 is the next one and so forth, and where the top line depicts a 4 ns mismatch, then 2 ns, 1 ns, 0 ns, −1 ns, −2 ns, and −4 ns, respectively, for the remaining lines.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A method of calibrating a wireless transmitting device, comprising:
   determining a propagation delay mismatch between a first test signal on a first signal path of the wireless transmitting device and a second test signal on a second signal path of the wireless transmitting device, wherein determining the propagation delay mismatch comprises:
      transmitting the first test signal having a first frequency on the first signal path;
      transmitting the second test signal having a second frequency different from the first frequency on the second signal path;
      measuring a phase difference between the first test signal and the second test signal; and
      determining a delay measurement between the first test signal and the
   second test signal based at least in part on the measured phase difference;
   determining the propagation delay mismatch using a difference between the delay measurement and a previously determined delay measurement; and
   adjusting delay circuitry of at least one of the first signal path and the second signal path to compensate for the propagation delay mismatch.

2. The method, as set forth in claim 1, comprising determining levels of the first test signal and the second test signal at least in part by:
   setting the first test signal to a first constant value;
   transmitting the first test signal having the first constant value through the wireless transmitting device;
   measuring a first gain of the first test signal having the first constant value; and
   determining a level of the second test signal based at least in part on the first constant value and the first gain.

3. The method, as set forth in claim 2, wherein determining the levels of the first test signal and the second test signal comprises:
   setting the first test signal to a second constant value;
   transmitting the first test signal having the second constant value through the wireless transmitting device;
   measuring a second gain of the first test signal having the second constant value; and
   in response to determining that a first gradient between the first gain and a reference gain is less than a second gradient between the second gain and the reference gain:
      determining the levels of the first test signal and the second test signal based at least in part on the second constant value.

4. The method, as set forth in claim 1, wherein determining the propagation delay mismatch comprises:
   determining a root mean square (RMS) voltage error of a plurality of voltage errors corresponding to a plurality of propagation delay mismatches comprising the propagation delay mismatch; and
   adjusting the delay circuit to compensate for the propagation delay mismatch and the maximum voltage error.

5. The method, as set forth in claim 1, wherein adjusting the delay circuitry of at least one of the first signal path and the second signal path to compensate for the propagation delay mismatch comprises:
   adjusting delay alignment circuitry of the first signal path.

6. The method, as set forth in claim 1, wherein adjusting the delay circuitry of at least one of the first signal path and the second signal path to compensate for the propagation delay mismatch comprises:
   adjusting a digital front end of the second signal path.

7. The method, as set forth in claim 1, wherein levels of the first test signal and the second test signal correspond to levels sufficient to place a power amplifier of the wireless transmitting device near saturation.

8. The method, as set forth in claim 1, wherein the first signal path comprises an envelope signal path and the second signal path comprises a quadrature (IQ) signal path.

9. The method, as set forth in claim 1, wherein the wireless transmitting device comprises an envelope tracking circuit having a power amplifier.

10. A wireless signal transmitting device, comprising:
   an envelope tracking circuit having a power amplifier and having an envelope signal path and a quadrature (IQ) signal path, wherein each path comprises a respective delay alignment circuit, and wherein the envelope signal path is configured to deliver an envelope signal to the power amplifier and the IQ signal path is configured to deliver a quadrature (IQ) signal to the power amplifier; and
   a calibration device configured to be operably coupled to the envelope tracking circuit, wherein the calibration device is configured to:
      determine a propagation delay mismatch between a first test signal on the envelope signal path and a second test signal on the IQ signal path, wherein to determine the propagation delay mismatch, the calibration device is configured to:
         transmit the first test signal having a first frequency on the envelope signal path;
         transmit the second test signal having a second frequency different from the first frequency on the IQ signal path;

measure a phase difference between the first test signal on the envelope signal path and the second test signal on the IQ signal path; and determine a delay measurement between the first test signal on the envelope signal path and the second test signal on the IQ signal path based at least in part on the measured phase difference and a difference between the first frequency and the second frequency;

determine the propagation delay mismatch using a difference between the delay measurement and a previously determined delay measurement; and adjust the respective delay alignment circuit of at least one of the envelope signal path and the IQ signal path to compensate for the propagation delay mismatch.

11. The device, as set forth in claim 10, wherein, to determine levels of the first test signal and the second test signal, the calibration device is configured to:

set the first test signal to a first constant value;

transmit the first test signal having the first constant value through the envelope signal path;

measure a first gain of the first test signal having the first constant value; and determine a level of the second test signal based at least in part on the first constant value and the first gain.

12. The device, as set forth in claim 11, wherein to determine the levels of the first test signal and the second test signal, the calibration device is configured to:

set the first test signal to a second constant value;

transmit the first test signal having the second constant value through the envelope signal path;

measure a second gain of the first test signal having the second constant value; and in response to determining that a first gradient between the first gain and a reference gain is less than a second gradient between the second gain and the reference gain:

determine the levels of the first test signal and the second test signal based at least in part on the second constant value.

13. The device, as set forth in claim 11, wherein, to determine the propagation delay mismatch, the calibration device is configured to:

determine a maximum voltage error from among a plurality of voltage errors corresponding to the plurality of propagation delay mismatches; and adjust the respective delay alignment circuit to compensate for the propagation delay mismatch and the maximum voltage error.

14. The device, as set forth in claim 11, wherein, to adjust the respective delay alignment circuit of at least one of the envelope signal path and the IQ signal path to compensate for the propagation delay mismatch, the calibration device adjusts a delay alignment circuit of only the envelope signal path.

15. The device, as set forth in claim 11, wherein, to adjust the respective delay alignment circuit of at least one of the envelope signal path and the IQ signal path to compensate for the propagation delay mismatch, the calibration device adjusts only a digital front end of the IQ signal path.

16. The device, as set forth in claim 11, wherein levels of the first test signal and the second test signal correspond to levels sufficient to place the power amplifier near saturation.

17. An electronic device, comprising:

at least one processor;

an input/output interface operably coupled to the at least one processor, the input/output interface having an envelope tracking circuit having a power amplifier an envelope signal path, and a quadrature (IQ) signal path, wherein each path comprises a respective delay alignment circuit, and wherein the envelope signal path is configured to deliver an envelope signal to the power amplifier and the IQ signal path is configured to deliver a quadrature (IQ) signal to the power amplifier; and a calibration device configured to be operably coupled to the envelope tracking circuit, wherein the calibration device is configured to:

determine levels of a first test signal and a second test signal to achieve compression in the power amplifier, wherein, to determine the levels of the first test signal and the second test signal, the calibration device is configured to:

set the first test signal to a first constant value;

transmit the first test signal having the first constant value through the envelope signal path;

measure a first gain of the first test signal having the first constant value;

set the first test signal to a second constant value;

transmit the first test signal having the second constant value through the envelope signal path;

measure a second gain of the first test signal having the second constant value; and in response to determining that a first gradient between the first gain and a reference gain is less than a second gradient between the second gain and the reference gain:

determine the levels of the first test signal and the second test signal based at least in part on the second constant value;

determine a propagation delay mismatch between the first test signal on the envelope signal path and the second test signal on the IQ signal path wherein to determine the propagation delay mismatch, the calibration device is configured to:

transmit the first test signal having a first frequency on the envelope signal path;

transmit the second test signal having a second frequency different from the first frequency on the IQ signal path;

measure a phase difference between the first test signal on the envelope signal path and the second test signal on the IQ signal path; and determine a delay measurement between the first test signal on the envelope signal path and the second test signal on the IQ signal path based at least in part on the measured phase difference and a difference between the first frequency and the second frequency; and adjust the respective delay alignment circuit of at least one of the envelope signal path and the IQ signal path to compensate for the propagation delay mismatch.

18. The device, as set forth in claim 17, wherein, to determine the propagation delay mismatch, the calibration device is configured to:

determine distortion in the determined delay measurement between the first test signal on the envelope signal path and the second test signal on the IQ signal path.

19. The device, as set forth in claim 17, wherein, to adjust the respective delay alignment circuit of at least one of the envelope signal path and the IQ signal path to compensate for the propagation delay mismatch, the calibration device adjusts a delay alignment circuit of only the envelope signal path.

20. The device, as set forth in claim 17, wherein, to adjust the respective delay alignment circuit of at least one of the envelope signal path and the IQ signal path to compensate for the propagation delay mismatch, the calibration device adjusts only a digital front end of the IQ signal path.

21. The device, as set forth in claim 17, wherein the levels of the first test signal and the second test signal correspond to levels sufficient to place the power amplifier near saturation.

22. The device, as set forth in claim 17, wherein the electronic device comprises a smartphone, a tablet computer, a personal computer, a camera, an entertainment system, or a wearable device.

23. The device, as set forth in claim 17, comprising a display operably coupled to the at least one processor.

24. The device, as set forth in claim 17, comprising a user interface operably coupled to the at least one processor.

25. The method, as set forth in claim 1, wherein transmitting the first test signal having the first frequency on the first signal path comprises transmitting an amplitude modulated double sideband suppressed carrier cosine (AM DSB-CS) signal on the first signal path.

26. The method, as set forth in claim 1, comprising:
determining levels of the first test signal and the second test signal to achieve compression.

27. The method, as set forth in claim 1, wherein adjusting the delay circuitry of at least one of the first signal path and the second signal path to compensate for the propagation delay mismatch comprises at least one of the following:
adjusting delay alignment circuitry that the first signal path includes as the delay circuitry, wherein the delay alignment circuitry is configured to reduce a delay between the first signal path and the second signal path by modifying a signal on the first signal path; and
adjusting a digital front end circuit that the second signal path includes as the delay circuitry, wherein the digital front end circuit is configured to reduce the delay between the first signal path and the second signal path by modifying a signal on the second signal path.

28. The device, as set forth in claim 11, wherein the calibration device is configured to determine levels of the first test signal and the second test signal to achieve compression in the power amplifier.

* * * * *

UNITED STATES PATENT AND TRADEMARK OFFICE
CERTIFICATE OF CORRECTION

PATENT NO. : 10,716,080 B2
APPLICATION NO. : 15/019421
DATED : July 14, 2020
INVENTOR(S) : Dan Wohlberg et al.

It is certified that error appears in the above-identified patent and that said Letters Patent is hereby corrected as shown below:

In the Claims

Column 12, Claim 17, Line 1, please insert --;-- between the words "amplifier" and "an".

Signed and Sealed this
Eighth Day of December, 2020

Andrei Iancu
*Director of the United States Patent and Trademark Office*